US008300842B2

(12) United States Patent
Vaishya

(10) Patent No.: US 8,300,842 B2
(45) Date of Patent: Oct. 30, 2012

(54) ROBUST SYSTEM FOR SOUND ENHANCEMENT FROM A SINGLE ENGINE SENSOR

(75) Inventor: Manish Vaishya, Rochester Hills, MI (US)

(73) Assignee: Mahle International GmbH, Stuttgart (DE)

( * ) Notice: Subject to any disclaimer, the term of this patent is extended or adjusted under 35 U.S.C. 154(b) by 1438 days.

(21) Appl. No.: 11/120,706

(22) Filed: May 3, 2005

(65) Prior Publication Data

US 2005/0259830 A1 Nov. 24, 2005

Related U.S. Application Data

(60) Provisional application No. 60/573,673, filed on May 21, 2004.

(51) Int. Cl.
*H03B 29/00* (2006.01)
*H04B 1/00* (2006.01)

(52) U.S. Cl. ..... 381/71.4; 381/71.14; 381/86; 381/71.9; 381/71.2; 381/71.8

(58) Field of Classification Search ................. 381/71.4, 381/71.14, 71.9, 71.2, 71.8, 71.86, 86, 771.8; 379/406.01
See application file for complete search history.

(56) References Cited

U.S. PATENT DOCUMENTS

| | | | | |
|---|---|---|---|---|
| 5,222,148 | A * | 6/1993 | Yuan | 381/71.9 |
| 5,371,802 | A * | 12/1994 | McDonald et al. | 381/71.4 |
| 5,850,458 | A * | 12/1998 | Tomisawa et al. | 381/71.4 |
| 2001/0046300 | A1* | 11/2001 | McLean | 381/71.4 |
| 2003/0152216 | A1* | 8/2003 | Vaishya | 379/406.01 |

* cited by examiner

*Primary Examiner* — Devona Faulk
(74) *Attorney, Agent, or Firm* — Carlson, Gaskey & Olds, P.C.

(57) ABSTRACT

A noise enhancement system for an automobile utilizes a single input of engine speed to derive a control signal used to drive a speaker. The speaker generates sounds that enhance or replicate the desired sounds from the engine. The output from the speaker is crafted dependent on the vehicle operating conditions. Instead of multiple transducers and inputs the noise enhancement system of this invention utilizes the single input of engine RPM engine speed. By utilizing only engine speed, the noise enhancement system is cost effective and significantly less complex.

12 Claims, 2 Drawing Sheets

ROBUST SYSTEM FOR SOUND ENHANCEMENT FROM A SINGLE ENGINE SENSOR

CROSS REFERENCE TO RELATED APPLICATION

The application claims priority to U.S. Provisional Application No. 60/573,673 which was filed on May 21, 2004.

BACKGROUND OF THE INVENTION

This invention relates to a noise control system for an automobile. More particularly, this invention relates to a noise control system requiring only limited input for generating a noise control signal to enhance sounds produced by an automobile.

Active noise control systems for automotive applications are known for reducing or enhancing noise generated by a vehicle engine. An occupant within a passenger compartment of an automobile often can hear engine noises propagated through an air intake manifold. Typical active noise control systems include a speaker for generating a noise canceling or enhancing signal to provide an overall desirable engine sound. The speaker produces a sound determined with respect to current operating conditions of the engine to cancel or enhance engine noise as desired.

Typical active noise control systems require several different inputs from the vehicle engine for determining the necessary speaker output. Such information is acquired in some circumstances from a vehicle controller or by sensing directly from analog signals from various transducers. Each source of information requires a separate physical connection along with the accompanying control system support required to gather and use the information.

Some of the vehicle parameters that may be required to be read or predicted accurately include engine crank position, rotational speed, throttle opening, temperature, etc. The phase of the induction sound is sensitive to such parameters. Conventional systems rely upon many sensors to obtain information utilized in determining and generating a cancellation or enhancement sound.

Disadvantageously, multiple inputs from analog sensors or devices to the active noise control system add cost and use of information from the vehicle controller increases complexity. Either option requires relatively significant interfacing with existing vehicle electronics. Further, the required multiple interfaces with existing vehicle electronics and vehicle controllers have made an after-market noise control impractical.

Accordingly, is it desirable to develop a robust, durable and efficient noise enhancement system that can enhance sound quality within a passenger compartment while being simple to install and practical for after-market installation.

SUMMARY OF THE INVENTION

This invention is a noise control system for enhancing vehicle sounds that generates a sound corresponding with engine operating conditions utilizing a single input from the vehicle.

An example noise enhancement system according to this invention generates an audio output to enhance the noise emitted from the engine. The combined engine noise and audio output from the noise control system produces a more desirable overall noise pleasing to passengers within a passenger compartment of the vehicle. The example noise enhancement system utilizes a single input from the engine to generate a sound output from a speaker that combines with sound from the engine to produce desirable acoustic qualities.

The one input provides information to a controller of the system indicative of engine speed. Engine speed is a characteristic of engine performance that is available from many different sources, for example a tachometer. The one connection is the only input that is provided to the controller and all that is required by the example system to generate a desired signal from the speaker.

Accordingly, the noise enhancement system of this invention provides for a robust sound enhancement system through the use of a single input indicative of engine speed. No other signals or information is required to provide the desired sound enhancement output. Utilizing only a single input value indicative of engine speed reduces the overall complexity of this system while maintaining desired performance. Further, because only a single input is required, this system is favorable for installation as an after-market system.

These and other features of the present invention can be best understood from the following specification and drawings, the following of which is a brief description.

DETAILED DESCRIPTION OF THE PREFERRED EMBODIMENT

Figure 1:
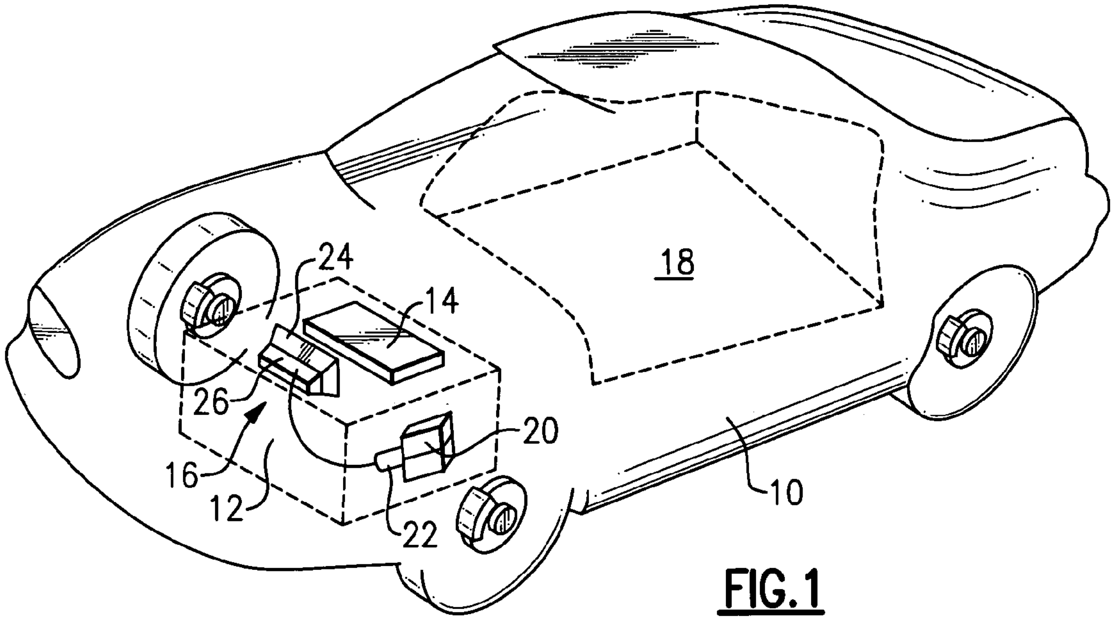
FIG. 1 is a schematic illustration of an example noise enhancement system according to this invention installed within a motor vehicle.

Referring to FIG. 1, a vehicle 10 includes an engine 12 having an intake manifold 14. In some instances sounds generated from the engine 12 are emitted through the intake manifold 14. An example noise enhancement system 16 according to this invention is shown that generates an audio output 15 to enhance the noise emitted from the engine 12. The combined engine noise and audio output 15 from the noise enhancement system 16 produces a more desirable overall noise pleasing to passengers within a passenger compartment 18 of the vehicle 10.

The example noise enhancement system 16 utilizes a single input from the engine 12 to generate a sound output from speaker 24 that combines with sound from the engine 12 to produce desirable acoustic qualities. The single input provides information to a controller 26 of the system 16 indicative of engine speed. Engine speed is a characteristic of engine performance that is available from many different sources. In this example a tachometer 20 provides information to the controller 26 via a single connection 22. The one connection 22 is the only input that is provided to the controller 26 and all that is required by the example system 16 to generate a desired signal from the speaker 24.

Figure 2:
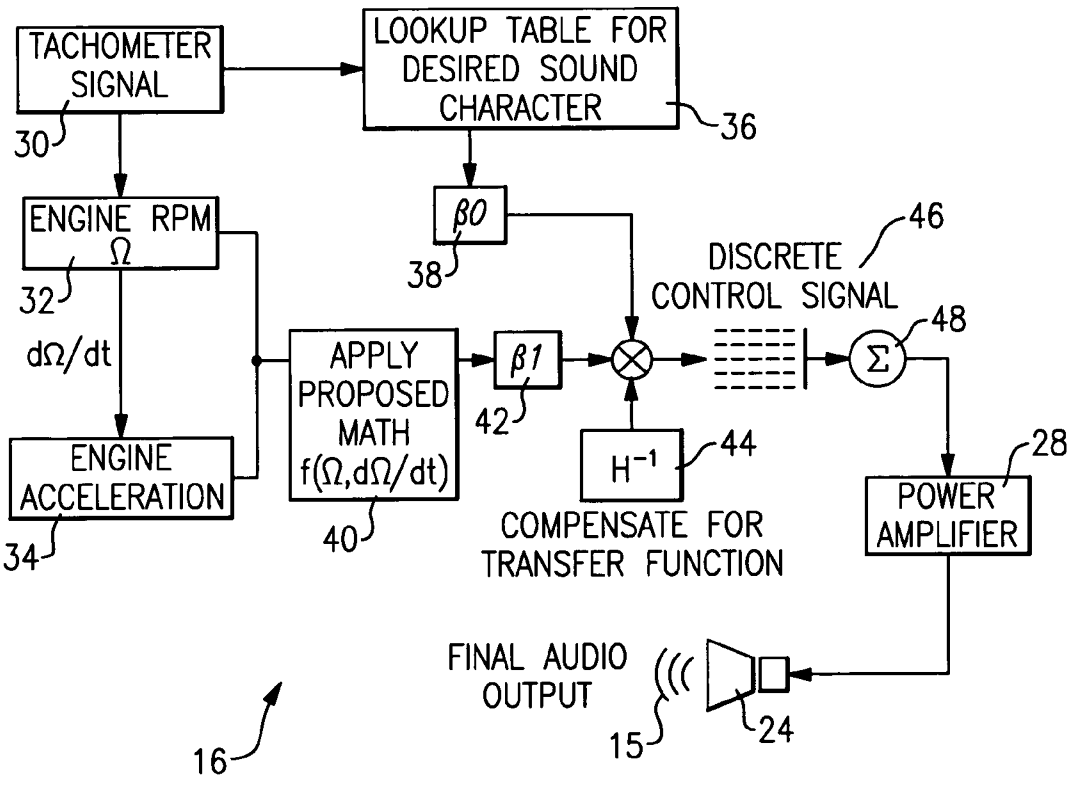
FIG. 2 is a process flow diagram of an example noise enhancement system according to this invention.

Referring to FIG. 2, operation of the noise enhancement system 16 is schematically shown and includes the initial step of reading a tachometer signal 30. The tachometer signal 30 provides information indicative of engine speed as indicated at 32. The engine speed is then derived to determine engine angular acceleration as shown at 34. With knowledge of the engine speed 32 and engine angular acceleration 34, a signal is derived for output by speaker 24. The control signal that is utilized to drive the final noise output from the speaker 24 is arrived at by first using the tachometer signal 30 in concert with a desired setting provided by a lookup table as indicated at 36. The tachometer signal 30 is indicative of engine speed and provides the initial sound character value indicated at 38. This initial sound character value is combined with an acoustic gain value as indicated at 42.

The acoustic gain value 42 is determined by using both engine speed 32 and engine angular acceleration along with an inventive algorithm 40. The inventive algorithm 40 utilizes engine speed and engine acceleration to predict various driving conditions. Different driving conditions have different engine sound qualities that are generally expected by a passenger of the vehicle 10. The specific driving characteristics result in specific and known engine behavior. This known engine behavior is utilized to predict the proper acoustic gain value 38 that is required to provide and enhance the noise signal emitted from the speaker 24.

The noise enhancement system 16 utilizes information derived from the engine speed signal 30 to determine and predict the current driving conditions. The sound emitted from the speaker 24 is therefore modified in view of the predicted driving conditions. As is appreciated, certain driving conditions will result in a certain quality of noise or sound emitted from the engine 112. This quality of noise emitted from the engine 12 is based on typical driving experiences of an operator. The noise enhancement system 16 of this invention adjusts predicts and crafts the audio signal 15 from the speaker 24 to replicate and enhance engine noise as is expected for the different driving conditions.

Some examples of the types of driving conditions that are correlated to the engine speed signal 30 include driving uphill or downhill, driving with a high or low load, up shifting or downshifting of a vehicle transmission along with accelerating and decelerating. The engine speed 32 and the engine angular acceleration 34 are analyzed to determine the current condition and predict how these conditions are changing during use so that the sound emitted by the speaker 24 can be crafted to match and produce an overall desirable sound quality.

Certain engine behavior for passenger vehicles is indicative of certain vehicle operating conditions. For instance it is understood that high throttle conditions generally mean that a vehicle is accelerating. Under braking conditions, a throttle is always closed and the vehicle will be decelerating. A gearshift either upwards or downwards is characterized by rapid change in engine speed. Such conditions can be determined with the engine speed 32 and engine angular acceleration 34.

Engine angular acceleration 34 is generally faster at lower engine speeds for the same throttle opening. In other words, at lower engine speeds, acceleration of the vehicle would be much greater for the same throttle opening as compared to the same throttle opening at higher engine speeds. When a vehicle is in a neutral gear the engine acceleration will be much faster as there is no load on the vehicle.

This invention includes an algorithm utilizing engine speed 30 and engine angular acceleration 34 to predict the current driving conditions such that the sound emitted form the speaker 24 may be properly adapted to provide the desired overall sound quality. The algorithm predicts future engine sound and uses this prediction to determine the proper input for the speaker 24.

These formulations or conditions provide the input required to predict and apply a proper value for the acoustic gain 42 for an engine speed 32 and angular acceleration 34. Each range of engine speed 32 and engine acceleration 34 provides a different value for acoustic gain 42, symbolically represented as $\beta 1$. What follows is an example set of ranges and accompanying values for the acoustic gain 42 that are utilized to drive the speaker 24. $\Omega$ denotes engine speed, $\dot{\Omega}$ denotes derived engine angular acceleration and $\beta 1$ is the acoustic gain. The various examples of engine angular acceleration and engine speed represent or provide an indication of the specific acoustic gain that is required.

Range 1 below represents acceleration at a low engine speed as is indicated by the low engine speed and the relatively high angular acceleration. Acoustic gain during operation in this range is 1.0 indicating that full scale output is produced to get the acoustic quality value.

Range 1: $\dot{\Omega} \geqq 400$ rpm/s and $\Omega < 3000$ rpm, $\beta 1 = 1.0$ (acceleration at low speed).

Range 2 represents acceleration at a high engine speed. The angular acceleration in this range is less than that of Range 1. As appreciated this is so because at higher engine speeds, common throttle openings would represent different accelerations. In this example the lower range of angular acceleration indicates the acceleration at the higher engine speeds.

Range 2: $\dot{\Omega} \geqq 100$ rpm/s and $\Omega > 3000$ rpm, $\beta 1 = 1.0$ (acceleration at high speed).

Range 3 indicates deceleration as the engine speed is low and angular acceleration is negative. The acoustic gain can be 0.1 if driving or 0 if this is a neutral condition. Range 4 indicates a deceleration from a high engine speed and modifies the acoustic gain to a value of 0.25, thereby modifying the overall sound character.

Range 3: $\dot{\Omega} < -100$ rpm/s and $\Omega < 3000$ rpm, $\beta 1 = 0.1$ (or 0) (deceleration)

Range 4: $\dot{\Omega} < 0$ rpm/s and $\Omega > 4000$ rpm, $\beta 1 = 0.25$

Range 5 indicates that the vehicle is under a low acceleration condition where the engine speed is low and the acceleration is low. The acoustic gain value is therefore low to accommodate and craft the sound output to provide the desired overall engine noise.

Range 5: $0 \leqq \dot{\Omega} < 400$ rpm/s and $\Omega < 3000$ rpm, $\beta 1 = 0.5$ (low acceleration, low speed)

Range 6 indicates that the vehicle is at high speed and undergoing slow acceleration. The ranges of engine angular acceleration and engine speed indicated in example range 6 illustrate the characteristic of accelerating slower at higher engine speeds. The acoustic gain is thereby provided at a value that will so modify the overall sound emitted from the speaker.

Range 6: $\dot{\Omega} < 100$ rpm/s and $\Omega > 3000$ rpm, $\beta 1 = 0.5$ (slow acceleration, high speed)

Range 7 is indicative of the vehicle moving in reverse and therefore the acoustic gain is set to a 0 value.

Range 7: $\Omega < 0$ rpm $\beta 1 = 0$ (reverse)

Range 8 includes a negative engine angular acceleration value and a low engine speed that indicates a gearshift in progress. The acoustic gain does not change during this time as this only a temporary condition. The controller 26 recognizes the combined engine angular acceleration values and engine speed values as a gear shift and does not modify the signal to the speaker 24.

Range 8: $\dot{\Omega} < -1000$ rpm/s or $\dot{\Omega} > 1000$ rpm/s, $\beta 1$ = unchanged (gearshift)

Each range of engine angular acceleration and engine speed corresponds with a specific desired acoustic gain value. These acoustic gain values are combined with the overall sound character 38. The sound character 38 is a desired value determined by a passenger to adjust the overall sound emitted from the vehicle. The sound character 38 can include adjustments to make the vehicle sound more powerful or sportier as well as adjustments to minimize sound.

The specific ranges are examples of values and are only one set of possible example ranges that may be utilized to predict a desired acoustic gain value. These relationships between engine angular acceleration and engine speed are utilized to provide and formulate a general equation that is in turn utilized to determine the specific acoustic gain. Equation 1 provides the general relationship between engine angular acceleration 34 and engine speed 32 that is utilized to adjust acoustic gain in view of engine operation.

$$\beta 1 = \frac{1}{4}\left(\frac{\Omega}{2000}\right) + \mathrm{sgn}(\dot{\Omega}) \times \left(\frac{\dot{\Omega}}{400}\right)^2: \qquad \text{Equation 1}$$

Once the acoustic gain value 42 has been determined, it is combined with the acoustic sound character 38 to provide an initial signal that is utilized to drive the speaker 24. This signal is then combined with a compensation transfer function 44. This compensation transfer function 44 is applied to compensate for non-uniform values within the frequency response. This signal is then converted to a discreet control signal 46, then through summation step 48 that combines each of the variables that have been derived from the tachometer signal to drive the speaker 24.

The controller 24 sends the signal through a power amplifier 28. The power amplifier 28 converts the control signals that have been determined by the various predictions and derivations originating from the original tachometer signal 30 to an electrical signal that is used to drive the speaker 24. The speaker 24 then emits audio output 15 that enhances and combines with the sound emitted from the engine 12 through the intake manifold 14 to provide the desired enhanced sounds.

Figure 3:
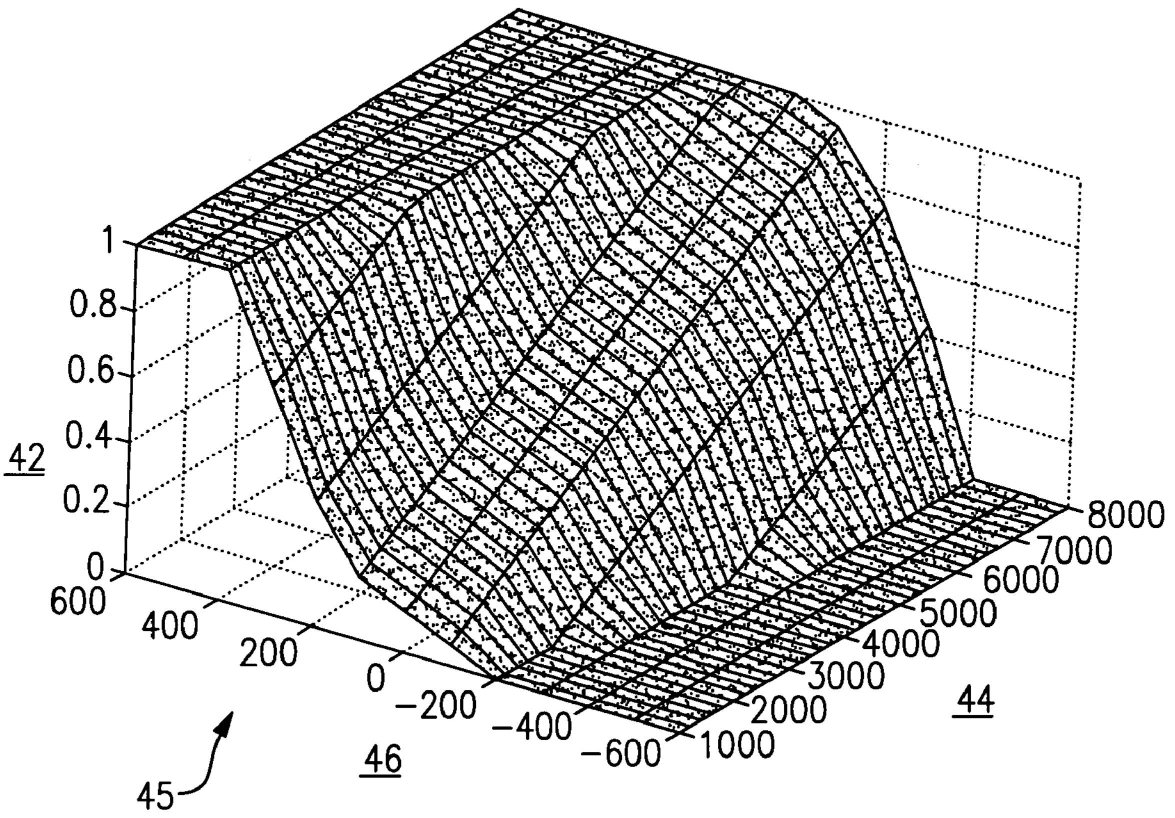
FIG. 3 is a graph representing an acoustic gain relative to engine speed and engine angular acceleration.

Referring to FIG. 3, the relationship between acoustic gain value, engine speed and engine angular acceleration is illustrated by graph 45 and includes engine speed values 44, engine angular acceleration values 46. The engine speed values 44 and an engine angular acceleration 46 are combined according to the relationship described by Equation 1 to provide a desired acoustic gain value 42. This acoustic gain value 42 provides for the prediction of a desired sound character that is emitted from the speaker 24.

Accordingly, the noise enhancement system 16 of this invention provides for robust sound enhancement through the use of a single input indicative of engine speed. No additional signals or information are required to provide the desired sound enhancement. The simplicity of this system by utilizing only a single input value that is indicative of engine speed reduces the overall complexity of this system while maintaining acceptable performance. Further, because only the single input of engine speed is required, this inventive noise enhancement system 16 is favorable for installation as an after-market system.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. An active noise control system, comprising:

a speaker for generating a noise enhancement signal; and a controller that controls the speaker with a control signal corresponding to the noise enhancement signal, the controller receiving only one signal obtained from a vehicle tachometer indicative of engine speed and deriving additional values required from the received vehicle tachometer for calculating the control signal based upon a predicted future engine sound, wherein the predicted future engine sound is determined using input signal from the vehicle tachometer and a value derived from the input signal from the vehicle tachometer indicative of engine angular acceleration.

2. The system as recited in claim 1, wherein said controller determines a basic sound character as a function of engine speed.

3. The system as recited in claim 2, wherein said controller determines a gain value corresponding to said basic sound character based on said estimated engine speed acceleration.

4. An active noise control system, comprising:

a speaker for generating a noise enhancement signal; and a controller that controls the speaker with a control signal corresponding to the noise enhancement signal, the controller determines an estimated engine speed acceleration using one signal indicative of engine speed and generates the control signal based upon the one signal indicative of engine speed, wherein said controller determines an acoustic gain based on the following relationship, and other metrics:

$$\beta 1 = \frac{1}{4}\left(\frac{\Omega}{2000}\right) + \mathrm{sgn}(\dot{\Omega}) \times \left(\frac{\dot{\Omega}}{400}\right)^2$$

where:

$\Omega$=engine speed;

$\dot{\Omega}$=engine angular acceleration; and $\beta 1$=acoustic gain.

5. The system as recited in claim 1, wherein said controller includes one connection to a vehicle for receiving said one signal indicative of engine speed.

6. A method of controlling an active noise control system, comprising:

a) detecting only one signal indicative of engine speed from a vehicle tachometer;

b) determining an engine angular acceleration based on the one signal indicative of engine speed received from the vehicle;

c) predicting a future engine sound based on the one signal indicative engine speed and the angular acceleration determined based on the one signal indicative of engine speed from the vehicle; and d) calculating a noise control signal based on the predicted future engine sound.

7. The method as recited in claim 6, wherein said step c) includes determining a basic sound character by determining a fundamental engine frequency and order content for each harmonic based on engine speed.

8. The method as recited in claim 7, wherein said step c) includes determining a gain corresponding with the basic sound character based on the engine speed and the angular acceleration.

9. The method as recited in claim 6, including the step of predicting vehicle driving conditions based on the signal indicative of engine speed and determines an acoustic gain value based on the predicted vehicle driving conditions.

10. A method of controlling an active noise control system, comprising:

detecting one signal indicative of engine speed;

determining an engine angular acceleration based on the signal indicative of engine speed;

generating a noise control signal using the engine speed and the angular acceleration;

predicting vehicle driving conditions based on the one signal indicative of engine speed; and determining an acoustic gain value based on the predicted vehicle driving conditions, wherein said step of determining an acoustic gain value further comprises determining an acoustic gain value according to the following relationship, and other metrics:

$$\beta 1 = \frac{1}{4}\left(\frac{\Omega}{2000}\right) + \text{sgn}(\dot{\Omega}) \times \left(\frac{\dot{\Omega}}{400}\right)^2$$

where:

$\Omega$=engine speed;

$\dot{\Omega}$=engine angular acceleration; and $\beta 1$=acoustic gain.

11. The method as recited in claim 6, wherein the signal for detecting engine speed is a tachometer signal.

12. The method as recited in claim 11, including the step of selecting a desired sound character based on the tachometer signal.

* * * * *